US008766618B2

(12) United States Patent  
Jochmann et al.

(10) Patent No.: US 8,766,618 B2  
(45) Date of Patent: Jul. 1, 2014

(54) SUPPLYING VOLTAGE IN A CIRCUIT USING A FIRST VOLTAGE SOURCE AND AN ADJUSTABLE SECOND VOLTAGE SOURCE

(75) Inventors: Sven Jochmann, Dresden (DE); Lutz Dathe, Dresden (DE)

(73) Assignee: Atmel Corporation, San Jose, CA (US)

( * ) Notice: Subject to any disclaimer, the term of this patent is extended or adjusted under 35 U.S.C. 154(b) by 1151 days.

(21) Appl. No.: 12/580,711

(22) Filed: Oct. 16, 2009

(65) Prior Publication Data

US 2010/0102632 A1    Apr. 29, 2010

Related U.S. Application Data

(60) Provisional application No. 61/117,398, filed on Nov. 24, 2008.

(30) Foreign Application Priority Data

Oct. 28, 2008   (DE) .......................... 10 2008 053 536

(51) Int. Cl.  
*G05F 1/00*   (2006.01)

(52) U.S. Cl.  
USPC ......................................................... 323/298

(58) Field of Classification Search  
USPC .............................. 323/298; 327/143; 361/18  
See application file for complete search history.

(56) References Cited

U.S. PATENT DOCUMENTS

| 5,297,098 A | 3/1994 | Nakatani et al. |
| 5,822,246 A | 10/1998 | Taub et al. |
| 6,313,615 B1 * | 11/2001 | Fayneh et al. ................. 323/281 |
| 7,126,317 B2 * | 10/2006 | Schreck ........................ 323/282 |
| 7,205,750 B2 * | 4/2007 | Murakami ..................... 323/267 |
| 7,256,571 B1 * | 8/2007 | Mimberg et al. ............. 323/267 |
| 7,715,157 B2 * | 5/2010 | Inoue .............................. 361/18 |

(Continued)

FOREIGN PATENT DOCUMENTS

| CN | 1486531 A | 3/2004 |
| CN | 1252722 C | 4/2006 |
| DE | 102 23 763 A1 | 5/2003 |

OTHER PUBLICATIONS

An Guochen et al., "Programmable Voltage Regulator Design based on Digitally Controlled Potentiometer", the Eighth International Conference on Electronic Measurement and Instruments 2007, pp. 453-456.  
Tietze et al., "Halbleiter-Schaltungstechnik" (Semiconductor Technology), 12$^{th}$ ed., 2002, pp. 926-936.  
Office Action for Chinese Patent Application 200910208104.0, Mar. 1, 2012.

(Continued)

*Primary Examiner* — Adolf Berhane  
*Assistant Examiner* — Yemane Mehari  
(74) *Attorney, Agent, or Firm* — Baker Botts LLP

(57) ABSTRACT

A circuit, use, and method for operating a circuit is provided that includes a regulated first voltage source for providing a supply voltage at an output of the first voltage source for a subcircuit, an adjustable second voltage source for providing an output voltage to supply the subcircuit, and an evaluation circuit, which is connected to an output of the second voltage source and to a control input of the second voltage source and to the output of the first voltage source. Wherein the evaluation circuit is formed to adjust the output voltage of the second voltage source by means of a control signal at the control input of the second voltage source with evaluation of the supply voltage at the output of the first voltage source, and wherein the evaluation circuit and/or the second voltage source have a memory for storing values of the adjustment.

20 Claims, 3 Drawing Sheets

(56) References Cited

U.S. PATENT DOCUMENTS

| | | | |
|---|---|---|---|
| 7,889,018 B2 * | 2/2011 | Elran | 331/176 |
| 8,089,306 B1 * | 1/2012 | Wright | 327/143 |
| 2003/0080717 A1 | 5/2003 | Kajimoto | |
| 2007/0297235 A1 | 12/2007 | Ballweber et al. | |
| 2008/0197914 A1 * | 8/2008 | Shimizu et al. | 327/541 |

OTHER PUBLICATIONS

Chinese Second Office Action and English Translation of Text of the Second Office Action, Patent Appl. No. 200910208104.0, Ser. No. 2012/082200882430, dated Aug. 27, 2012 and received Sep. 18, 2012 (13 pgs).

* cited by examiner

SUPPLYING VOLTAGE IN A CIRCUIT USING A FIRST VOLTAGE SOURCE AND AN ADJUSTABLE SECOND VOLTAGE SOURCE

This nonprovisional application claims priority to German Patent Application No. 10 2008 053 536.2, which was filed in Germany on Oct. 28, 2008, and to U.S. Provisional Application No. 61/117,398, which was filed on Nov. 24, 2008, and which are both herein incorporated by reference.

BACKGROUND OF THE INVENTION

1. Field of the Invention

The present invention relates to a circuit, a use, and a method for operating a circuit.

2. Description of the Background Art

Linear voltage regulators are known per se. Different circuits with regulated voltage sources as linear voltage regulators are known from "Halbleiterschaltungstechnik" (Semiconductor Technology), U. Tietze and C. Schenk, $12^{th}$ ed., 2002, pages 926 to 936.

SUMMARY OF THE INVENTION

It is an object of the present invention to improve a circuit as much as possible. Accordingly, a circuit is provided which can be monolithically integrated on a semiconductor chip. The circuit can be formed for operation via a battery.

The circuit can have a regulated first voltage source for providing a supply voltage for a subcircuit. The first voltage source can have an output which is connected to the subcircuit and at which the supply voltage is provided. The first voltage source can have a control amplifier and a reference voltage source. In this regard, the control amplifier regulates the supply voltage to a target value.

The circuit can have an adjustable second voltage source, which is formed to provide an output voltage to supply the subcircuit. The second voltage source can be formed to provide the output voltage in the case of a deactivated first voltage source. The second voltage source can have a switch for connecting the output voltage. The second voltage source can be formed to take over the supplying of the subcircuit, when the first voltage source is turned off. The second voltage source can have a series regulator, for example, an emitter follower or a source follower. The second voltage source can be formed to adjust at least the output voltage by a digital control signal. Further, an adjustment algorithm can be set up for adjusting the output voltage of the second voltage source to the output voltage of the first voltage source, whereby the adjusted voltage value can deviate, for example, by an LSB (lowest significant bit).

The circuit can have an evaluation circuit, which is connected to an output of the second voltage source, particularly for measuring an output voltage of the second voltage source. A control output of the evaluation circuit can be connected to a control input of the second voltage source. An input of the evaluation circuit is connected to an output of the first voltage source.

The evaluation circuit can be formed to adjust the output voltage of the second voltage source by a control signal, particularly a digital control signal, at the control input of the second voltage source. The evaluation circuit is formed to perform the adjustment of the output voltage of the second voltage source with evaluation of the supply voltage at the output of the first voltage source. The voltage at the output of the first voltage source is used in particular as a reference for the adjustment.

The evaluation circuit and/or the second voltage source can have a memory for storing a value of the adjustment. The memory can be connected or formed in such a way that the value of the adjustment is retained if the first voltage source is deactivated. Also, the memory can be connected to an input voltage connection of the circuit, particularly for connecting a battery.

A further object of the invention is to provide as improved a method as possible. Accordingly, a method for operating a circuit in an operating mode and a sleep mode is provided. Circuit current consumption in a sleep mode is reduced in comparison with the current consumption in the operating mode. Preferably, the number of functions of the circuit in the sleep mode is reduced in comparison with the operating mode.

In the operating mode, a subcircuit is supplied by a regulated first voltage source with a supply voltage. Preferably, the first voltage source is activated for the operating mode.

In a sleep mode, the first voltage source is deactivated. The subcircuit in the sleep mode is supplied by a second voltage source. The second voltage source is activated at least in the sleep mode.

In the operating mode, an output voltage of the second voltage source is adjusted automatically as a function of the supply voltage of the first voltage source. The adjustment of the output voltage in this case occurs preferably to a voltage value that enables retention of logical information in the subcircuit. The adjustment occurs by setting of a resistance value of a resistance device of the second voltage source. In this case, the output voltage depends on the resistance value. The resistance value can be set by connection or disconnection of ohmic resistors or preferably by connection or disconnection of active resistance elements, such as field-effect transistors.

An even further object of the invention is to provide a use. Accordingly, a use of a regulated first voltage source and an adjustable second voltage source for operating a subcircuit is provided. The operation of the subcircuit occurs in an operating mode by means of the first voltage source and in a sleep mode by means of the second voltage source. An output voltage of the second voltage source is adjusted during the operating mode as a function of a voltage at the output of the first voltage source and an output current of the second voltage source. The output current of the second voltage source is matched to a quiescent current which flows through the subcircuit in the sleep mode. The quiescent current in this case is made up of different partial currents, such as the leakage currents through the analog and/or digital subcircuit or a small quiescent supply current for a subcircuit with a low current take-up, such as, for example, a slow counter or a clock circuit (RTC—real-time clock).

The embodiments described hereinafter relate to the circuit, as well as to the use and to the method for operating a circuit. The functions of the circuit in this case emerge from the methods features. Likewise, the methods features emerge from the functions of the circuit.

According to an embodiment, the subcircuit is formed for an operating mode and a sleep mode. In the operating mode, the subcircuit is formed to draw an operating current. In the sleep mode, in contrast, a quiescent current, reduced compared with the operating current, flows through the subcircuit.

The first voltage source can be activated in the operating mode. Preferably, in the sleep mode, the first voltage source is deactivated and the second voltage source activated. The evaluation circuit can be set up for adjustment in the operating mode. In this case, the adjustment can occur at least during the first initiated operating mode.

In another embodiment, it is provided that the evaluation circuit has a current source as a load for the output of the second voltage source during the adjustment in the operating mode. Preferably, the current of the current source is on the order of the quiescent current through the subcircuit in the sleep mode. The current through the current source does not deviate from the quiescent current flowing in the sleep mode through the subcircuit by more than the factor of twenty, preferably by more than the factor of ten. The current can flow through the current source in a current strength between 0.1 µA and 10 µA. Too large deviations between the current of the current source and the quiescent current in the sleep mode could have the result that the output voltage of the second voltage source is no longer within the desired normal range.

According to an embodiment, the evaluation circuit has a comparator. For comparison of the output voltage of the second voltage source, the comparator can be connected to the supply voltage, provided by the first voltage source, and to the output of the second voltage source, as well as to the output of the first voltage source.

Preferably, the evaluation circuit has an arithmetic logic unit for evaluating the output voltage of the second voltage source and the supply voltage provided at the output of the first voltage source. The arithmetic logic unit can be formed as a state machine. It is also possible to form the arithmetic logic unit such that it is programmable. For example, the arithmetic logic unit can be formed as a microcontroller core. The arithmetic logic unit can be connected or is connected to an input voltage of the circuit, particularly to a battery voltage.

According to an embodiment, an input of the arithmetic logic unit can be connected to an output of the comparator to evaluate an output signal of the comparator.

In an embodiment, the evaluation circuit can be set up for adjusting the output voltage of the second voltage source preferably by means of particularly successive approximation. Alternatively, the output voltage of the second voltage source can be increased from a lowest voltage also stepwise until the necessary output voltage is reached.

According to an embodiment, the evaluation circuit can have a temperature sensor element for determining a circuit temperature, particularly of the subcircuit. Preferably, the evaluation circuit is set up to map the values of the adjustment onto the circuit temperature. If the temperature response of the circuit is known, the evaluation of the temperature as a temperature current value or temperature voltage value can be eliminated.

In an embodiment, it is provided that the second voltage source can have a current source and a resistance device for generating a reference voltage. Preferably, the evaluation circuit can be formed to match a current source temperature response as a function of an adjustment result.

According to an embodiment, the circuit can have a semiconductor switch for switching the output voltage of the second voltage source to the output of the second voltage source. To this end, the switch can be connected to an output driver transistor and to an output terminal.

The second voltage source can have a resistance device with a variable resistance value for setting the output voltage. A resistance device can have a plurality of resistance elements. A resistance element can be, for example, an ohmic resistor or an active element, such as a field-effect transistor, whose drain is connectable to the gate.

The second voltage source can have a transistor wired as a source follower or emitter follower. Preferably, a control input (gate/base) of the transistor is connected to the resistance device. A source or emitter of the transistor can be or is connected to an output of the second voltage source.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
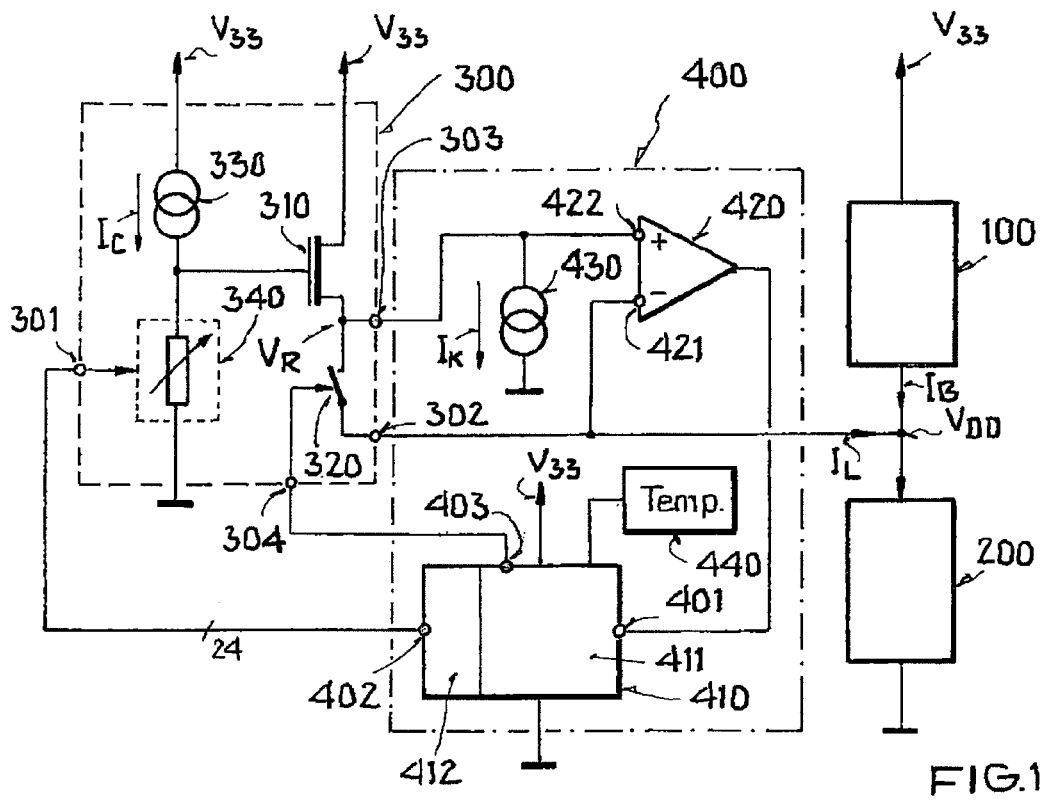
FIG. 1 shows a schematic circuit diagram of a circuit of an exemplary embodiment.

FIG. 1 shows a circuit with a first voltage source 100 and a second voltage source 300 schematically by means of a block diagram. Both voltage sources 100 and 300 are fed by an input voltage V33. The input voltage V33 can be applied as a battery voltage at a level of 3.3 V. First voltage source 100 and second voltage source 300 are connected to a subcircuit 200. Subcircuit 200 has, for example, an SRAM with stored information.

In an operating mode, the information stored in subcircuit 200 is modified, for example, to measure or to control or to perform other functions, such as communication over a radio channel. To this end, subcircuit 200 in the operating mode requires an operating current $I_B$, which is provided by first voltage source 100. First voltage source 100 has a linear voltage regulator, which is connected to a band-gap circuit for high accuracy of a provided supply voltage VDD for subcircuit 200. Preferably, the supply voltage VDD is matched to the subcircuit specification. The supply voltage VDD in this case is lower than the input voltage (3.3 V) and has, for example, a target voltage value of 1.8 V.

In the sleep mode, the information and/or logic states should be retained in subcircuit 200. Accordingly, a sufficient supply voltage must continue to be present in subcircuit 200. The supply voltage in the sleep mode cannot be provided by first voltage source 100, because the first voltage source has a too high current consumption, which would significantly shorten battery life. Only a quiescent current $I_L$, which is substantially lower than the operating current $I_B$, flows through subcircuit 200. Accordingly, the adjustable second voltage source 300 has its own current consumption, which does not exceed the quiescent current. As a result, the advantage of especially long battery operation is achieved.

So that in the sleep mode the information in subcircuit 200 is retained and subcircuit 200 is not damaged by overvoltage, an output voltage $V_R$ of second voltage source 300 is set in such a way that after deactivation of first voltage source 100 the output voltage $V_R$ of second voltage source 300 remains within a permissible voltage range. A voltage range of this type as a range between 1.6 V and 2.0 V is shown schematically in FIG. 2. At time t0, in the sleep mode, first voltage source 100 is deactivated. For the curve of the supply voltage VDD, which after time t0 approximates the output voltage $V_R$ of second voltage source 300, two permissible extreme courses are shown schematically in the diagram of FIG. 2 as limiting cases of permissible courses. In one case, the voltage VDD declines to the value of 1.6 V and, in the other, the voltage VDD increases to the value 2.0 V. The voltage value, which the voltage VDD achieves after time t0 in the sleep mode, depends on the accuracy of the adjustment of second voltage source 300 and optionally on the quiescent current $I_L$ through subcircuit 200 and optionally on a temperature change in regard to the adjustment time point.

Second voltage source 300 in this case has the advantage that it can output an accurate operating voltage VDD by an adjustment of its output voltage $V_R$. Moreover, it has the advantage that it itself has only a very low current take-up in order to supply, for example, large logic blocks of subcircuit 200 during a sleep mode, which can also be called a power-down phase. Second voltage source 300 is adjusted while main controller 100 is turned on. Adjustment element 340 is preferably formed as a resistance device and as a resistance device that or which can have a series connection of MOS transistors, which are fed by a constant current $I_C$ through current source 330. Furthermore, second voltage source 300 has an output driver transistor 310, which is connected to a first output 303 and via a semiconductor switch 320 to a second output 302. Output driver transistor 310 has no or a very low threshold voltage. Therefore, output driver transistor 310 is also called a "zero transistor." The output voltage $V_R$ is provided at a source terminal of output driver transistor 310.

An adjustment algorithm is implemented as a state machine 411 in an evaluation circuit 400. Evaluation circuit 400 has a comparator 420, whose first input 421 is connected to the output of first voltage source 100 and whose second input 422 is connected to first output 303 of second current source 300. Evaluation circuit 400 has a current source 430, through which a constant current $I_K$ flows, which is matched to the quiescent current $I_L$ through subcircuit 200 in the sleep mode. In the sleep mode, current source 430 is turned off together with the entire evaluation circuit 400. The constant current $I_K$ does not deviate from the quiescent current $I_L$ by more than the factor of twenty. The output of comparator 420 is connected to input 401 of state machine 411. Semiconductor switch 320 of first voltage source 300 can be controlled via control output 403 and via input 304. Semiconductor switch 320 is actuated by a higher-order system (not shown), when changed from the operating mode to the sleep mode and conversely. Evaluation circuit 400 reacts accordingly to the same signal. If the system is in the sleep mode, evaluation circuit 400 is awakened by means of a wake-up signal and semiconductor switch 320 is opened. The adjustment begins subsequently in the operational state. In the operational state, first voltage regulator 100 is active (operating mode). Depending on a rest signal (power down), semiconductor switch 320 is closed.

Furthermore, a digital part 410 of evaluation circuit 400 has a register 412 as the memory for storing the adjustment values. The adjustment values are thus also retained in the sleep mode, because digital part 410 of evaluation circuit 400 in the sleep mode as well is at the input voltage V33. The adjustment values in registers 412 control resistance device 340 via output 402 and via control input 301 of the second voltage source 300. The evaluation device furthermore has the advantage that an offset of the comparator is compensated. In this way, an error due to an offset voltage can be avoided. The constant current $I_K$ flows exclusively in the operating mode and not in the sleep mode, so that a battery supply can be significantly extended.

Register 412 can be overwritten by a connected arithmetic logic unit (not shown), for example, a microcontroller. Thus, writing and/or reading of the register contents by the connected arithmetic logic unit are possible. It is preferably provided that evaluation circuit 400 changes the temperature response of the current $I_C$ of current source 330 based on the adjustment results. To reduce the current consumption of evaluation circuit 400, comparator 420 is clocked by a clock signal. In addition, evaluation circuit 400 of the exemplary embodiment of FIG. 1 further has a temperature sensor element 440 to map a temperature of subcircuit 200 onto the adjustment values.

Figure 3:
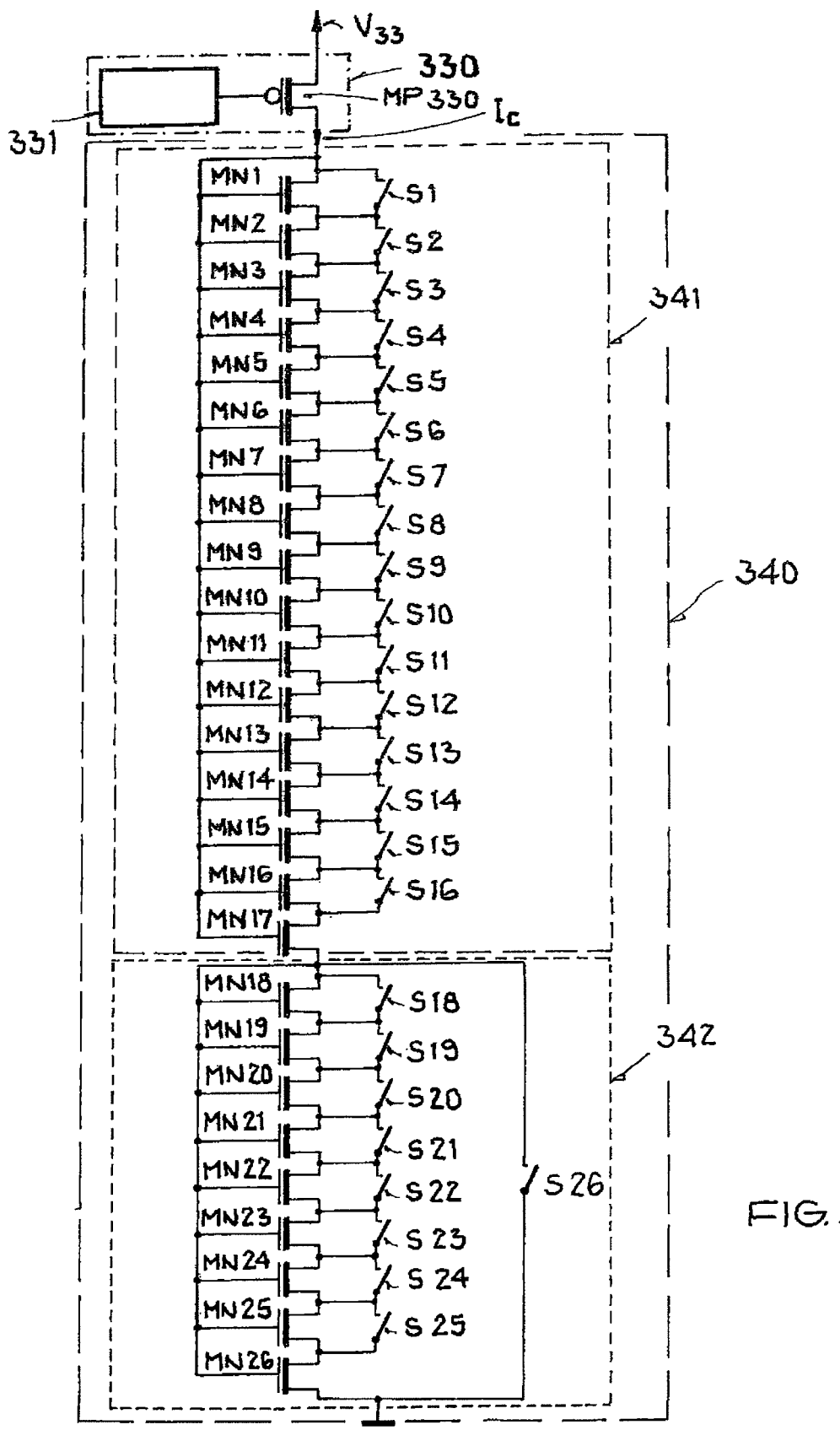
FIG. 3 shows an exemplary embodiment of an adjustable voltage source.

Voltage source 330 and resistance device 340 of first second voltage source 300 are shown as an exemplary embodiment in FIG. 3. Current source 330 has a PMOS transistor MP330, whose gate is connected to a current reference circuit 331. Said current source 330 generates a constant but relatively imprecise current $I_C$. Resistance device 340 has a fine adjustment circuit 341 and a coarse adjustment circuit 342. Coarse adjustment circuit 342 has NMOS transistors MN18, MN19, MN20, MN21, MN22, MN23, MN24, MN25, and MN26 as resistance elements in a series connection. The NMOS transistors MN18 to MN25 each can be short-circuited individually by a semiconductor switch S18, S19, S20, S21, S22, S23, S24, and S25. A semiconductor switch S26 short-circuits the entire series connection of the NMOS transistors MN18 to MN26.

Fine adjustment circuit 341 has NMOS transistors MN1, MN2, MN3, MN4, MN5, MN6, MN7, MN8, MN9, MN10, MN11, MN12, MN13, MN14, MN15, MN16, and MN17 as resistance elements in a series connection. The NMOS transistors MN1 to MN16 each can be short-circuited individually by a semiconductor switch S1, S2, S83, S4, S5, S6, S7, S8, S9, S10, S11, S12, S13, S14, S15, and 8S16. Semiconductor switches S1 to 26 can be controlled individually by means of values stored in a register of 412 via control input 301 of second voltage source 300.

Figure 4:
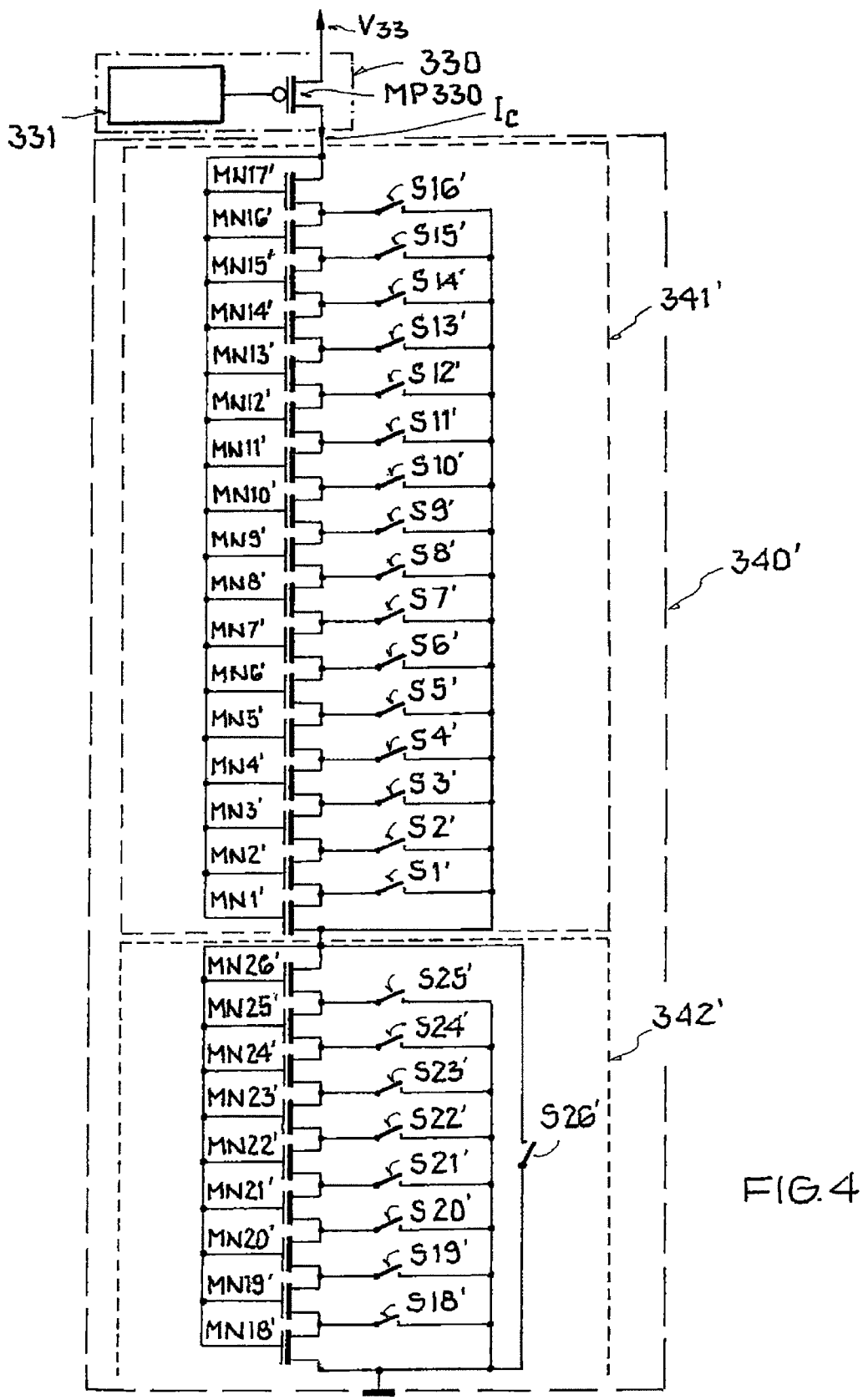
FIG. 4 shows another exemplary embodiment of an adjustable voltage source.

Another exemplary embodiment of a resistance device 340' is shown in FIG. 4. This as well has a series connection of resistance elements in the form of NMOS transistors MN1' to MN26' in a fine adjustment circuit 341'. However, semiconductor switches S1' to S26' are connected differently. Each of the semiconductor switches S1' to S16' short-circuits a source of the NMOS transistors MN2' to MN17' with the source of transistor MN1'. In this case, semiconductor switches S1' to S16' connect the respective source to a common node, which forms the connection to the coarse adjustment circuit 342'. Coarse adjustment circuit 342' has a series connection of NM08 transistors MN18' to MN26'; which can be bridged in stages by means of semiconductors switches S18' to S26'. Semiconductor switch S26' is used to bridge completely coarse adjustment circuit 342' under extreme adjustment conditions, when, for example, a too high output voltage is generated with resistance element MN26' alone.

Figure 2:
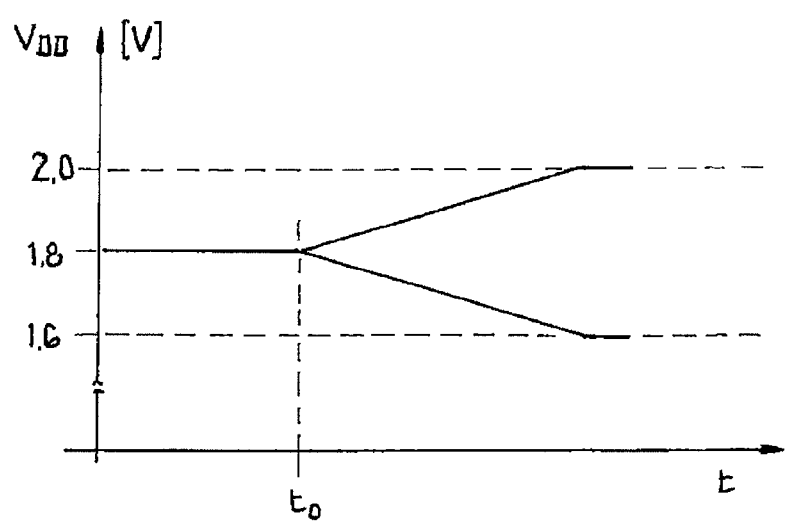
FIG. 2 shows a schematic diagram of a voltage curve of a supply voltage.

The invention is not limited to the shown embodiment variants in FIGS. 1 through 3. For example, it is possible to provide a different arrangement or number of resistance device elements. Preferably, the current $I_C$ of current source 330 is settable, so that the current $I_C$ is switched to a different value depending on the adjustment result. Semiconductor switch S26' is first opened or closed depending on the preceding adjustment result. Evaluation circuit 400 can perform the adjustment via a successive approximation algorithm. As an alternative to a comparator, an analog-to-digital converter can also be used. The functionality of the circuit according to FIG. 1 can be used, for example, for a universal radio system, in particular according to the industry standard ZigBee.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:
a regulated first voltage source configured to provide a supply voltage at an output of the first voltage source for a subcircuit;
an adjustable second voltage source configured to provide an output voltage to supply the subcircuit; and
an evaluation circuit connectable to an output of the second voltage source, to a control input of the second voltage source, and to the output of the first voltage source,
wherein the evaluation circuit is configured to adjust the output voltage of the second voltage source via a control signal at the control input of the second voltage source,
wherein the evaluation circuit is configured to adjust the output voltage based on an evaluation of the supply voltage at the output of the first voltage source,
wherein one or more of the evaluation circuit and the second voltage source has a memory configured to store values of the adjustment by the evaluation circuit,
wherein the subcircuit is configured to have an operating mode with an operating current through the subcircuit and a sleep mode with a quiescent current that is reduced in comparison to the operating current through the subcircuit, the first voltage source being activated in the operating mode, the first voltage source being deactivated and the second voltage source being activated in the sleep mode, and the evaluation circuit being configured for adjustment in the operating mode.

2. The circuit according to claim 1, wherein the evaluation circuit has a current source as a load for an output of the second voltage source, wherein a current of the current source is on the order of the quiescent current through the subcircuit.

3. The circuit according to claim 1, wherein the evaluation circuit has a comparator configured to compare the output voltage of the second voltage source and the supply voltage of the first voltage source.

4. The circuit according to claim 3, wherein the evaluation circuit has an arithmetic logic unit configured to evaluate an output voltage of the second voltage source and the supply voltage of the first voltage source, and wherein the arithmetic logic unit is connectable to an output of the comparator.

5. The circuit according to claim 1, wherein the evaluation circuit is configured to adjust an output voltage of the second voltage source via a successive approximation.

6. The circuit according to claim 1, wherein the second voltage source has a current source and a resistance device for generating a reference voltage.

7. The circuit according to claim 1, wherein the evaluation circuit is configured to match a temperature response of the current source as a function of an adjustment result.

8. The circuit according to claim 1, wherein the second voltage source has a resistance device with a variable resistance value for setting an output voltage, wherein the second voltage source has a transistor configured as a source follower or an emitter follower, wherein a control input of the transistor is connectable to the resistance device, and wherein a source or an emitter of the transistor is connectable to an output of the second voltage source.

9. The circuit according to claim 1, further comprising a semiconductor switch configured to switch an output voltage of the second voltage source to the output of the second voltage source.

10. A method for operating a circuit in an operating mode and a sleep mode, the method comprising:
supplying, in the operating mode, a subcircuit having a regulated first voltage source with a supply voltage; and
deactivating, in the sleep mode, the first voltage source and supplying the subcircuit with a second voltage source,
wherein, in the operating mode, an output voltage of the second voltage source is adjusted as a function of the supply voltage of the regulated first voltage source by setting a resistance value of a resistance device of the second voltage source.

11. A circuit comprising:
a regulated first voltage source configured to provide a supply voltage at an output of the first voltage source for a subcircuit;
an adjustable second voltage source configured to provide an output voltage to supply the subcircuit when the first voltage source is deactivated; and
an evaluation circuit connectable to an output of the second voltage source, to a control input of the second voltage source, and to the output of the first voltage source;
wherein the evaluation circuit is configured to adjust the output voltage based on an evaluation of the supply voltage at the output of the first voltage source.

12. The method according to claim 10, further comprising comparing the output voltage of the second voltage source and the supply voltage of the first voltage source.

13. The method according to claim 10, further comprising switching an output voltage of the second voltage source to the output of the second voltage source.

14. The method according to claim 10, further comprising storing values of the adjustment in a memory.

15. The circuit according to claim 11, wherein the evaluation circuit has a current source as a load for an output of the second voltage source, wherein a current of the current source is on the order of a quiescent current through the subcircuit.

16. The circuit according to claim 11, wherein the evaluation circuit has a comparator configured to compare the output voltage of the second voltage source and the supply voltage of the first voltage source.

17. The circuit according to claim 16, wherein the evaluation circuit has an arithmetic logic unit configured to evaluate an output voltage of the second voltage source and the supply voltage of the first voltage source, and wherein the arithmetic logic unit is connectable to an output of the comparator.

18. The circuit according to claim 11, wherein the evaluation circuit is configured to adjust an output voltage of the second voltage source via a successive approximation.

19. The circuit according to claim 11, wherein the second voltage source has a current source and a resistance device for generating a reference voltage.

20. The circuit according to claim 11, wherein the subcircuit is configured to have an operating mode and a sleep mode, the first voltage source being activated in the operating mode, and the first voltage source being deactivated and the second voltage source being activated in the sleep mode.

* * * * *